May 21, 1957 E. N. CLARKE 2,793,145

METHOD OF FORMING A JUNCTION TRANSISTOR

Filed June 13, 1952

INVENTOR
EDWARD N. CLARKE
BY Paul S. Martin
ATTORNEY

United States Patent Office 2,793,145

Patented May 21, 1957

2,793,145

METHOD OF FORMING A JUNCTION TRANSISTOR

Edward N. Clarke, Levittown, N. Y., assignor to Sylvania Electric Products Inc., a corporation of Massachusetts Application June 13, 1952, Serial No. 293,393

2 Claims. (Cl. 148—1.5)

This invention relates to the formation of multiple junction semiconductors, and more particularly to the method of preparing circuit elements utilizing such semiconductors.

It is an object of the present invention to provide a novel method of processing semiconductor bodies to obtain successive zones of opposite conductivity type each adjoining the other by an electrical barrier.

It is a further object of the present invention to provide a novel method for the uniform production of semiconductor bodies including preassigned zones of opposite conductivity types.

It is a still further object of the present invention to make a semiconductor body having two zones of material of like conductivity type separated by an intermediate zone of the opposite conductivity type and of well defined and readily controlled dimensions.

A still further object of the present invention is the provision of a method for the controlled production of multiple junction electrical translators having uniform electrical properties.

It is a still further object of the present invention to provide a semiconductor having successive regions of alternate conductivity type without depending on critical thickness of the semiconductor specimen.

It is still a further object of the present invention to form a multiple junction transistor in a novel manner facilitating control over the thickness of a layer of one conductivity type between regions of the opposite conductivity type.

The above and still further objects of the present invention will become apparent upon consideration of the following detailed description, when taken in conjunction with the accompanying drawings, wherein.

Conduction in semiconductors, notably silicon and germanium, has been classified as of two types, conduction by excess electrons conventionally designated as N-type conductivity and conduction by holes designated as P-type conductivity. In N-type semiconductor material the carrier is said to move in the unfilled or "conduction" band, while in the P-type the carrier is said to move in the "nearly full" or valence-bond band.

The conductivity type of the semiconductor material is controlled and regulated by the presence of impurities either included in the basic material found in nature or in the commercially available products. Small amounts of impurities, such as the group V elements, antimony, arsenic, and phosphorous each having a valence of five, are termed "donor" impurities when considering silicon and germanium of group I, since they contribute to the conductivity of the basic material by donating electrons to an unfilled conduction band. The electrons contributed by the "donor" impurities constitute current carriers of negative sign in the material. This material is designated an "N-type" semiconductor. Small amounts of other impurities, such as the group III elements including gallium, and indium each having a valence of three, as well as zinc, are termed "acceptor" impurities since they accept electrons from the "filled" or valence-bond band, thereby contributing to the conductivity by leaving "holes" in the filled band. Thereafter, interchange of the electrons remaining in the filled band provide a current carrier of positive sign in the material, hence the abbreviated designation "P-type" conductivity for such semiconductors. Where both types of impurities are present to limited extent, the conductivity type is controlled by the predominant impurity.

Where a crystal of semiconductor, as of germanium or silicon, has two regions of different semiconductor types adjoining at a barrier, the body will serve as an electrical rectifier, and is termed a "junction type" rectifier to distinguish it from the well-known "point contact" type of rectifier. Where two rectifying barriers are suitably close to each other, in a body of semiconductor separating two zones of the same conductivity type by an intermediate zone of the opposite conductivity type, and terminals are applied to these three zones, electrical amplification of signal input can be realized in what is thus termed a "junction transistor." The thickness of the intermediate zone is of special concern for, while it must be sufficiently thick to enable electrical terminal connection, it should be sufficiently thin to enable holes or electrons injected at one barrier to influence the current through the other barrier. It is to this type of device that the following disclosure relates.

Figure 1:
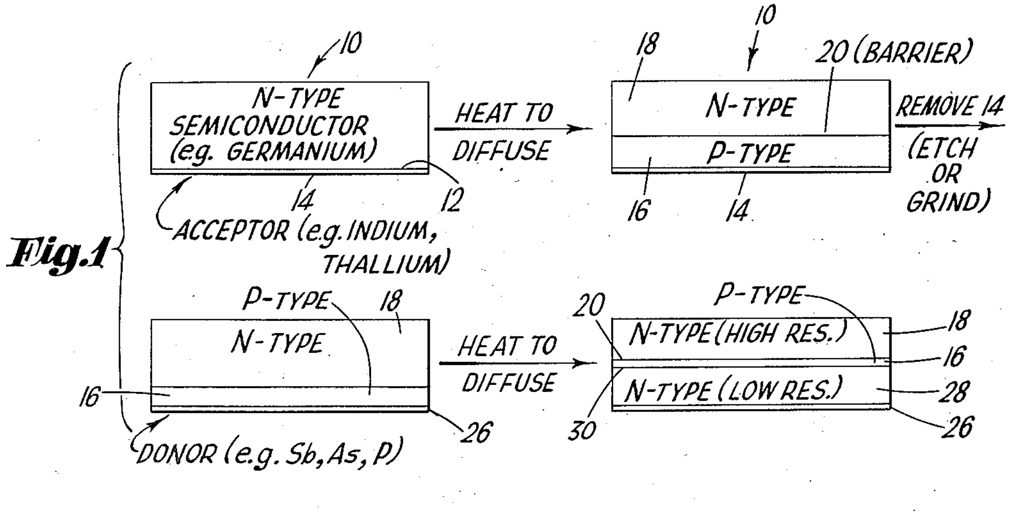
Fig. 1 is a diagrammatic view showing the sequential steps for processing a semiconductor in accordance with one method of the present invention.

In Fig. 1 a novel method is illustrated, starting with a material of N-type conductivity, however the sequentially processing contemplated is also applicable to P-type starting material. Specifically, a thin, flat body 10 of N-type, germanium is provided, prepared in accordance with well understood techniques. This body in the present method has a uniform layer 14 of acceptor impurities on one face 12. The impurity, such as a material of the group III elements, is applied to the face 12 of the body in any suitable manner, as for example, by vacuum-evaporating, electroplating, or sputtering. In broader aspect, one face is exposed in any controlled manner to a select impurity. The body 10 is heated, in contact with the impurity so that the impurity diffuses into the adjacent regions of N-type germanium and causes a layer or zone 16 of the body 10 to be converted into P-type material. The heat treatment for diffusing the impurity layer is regulated as to temperature and duration, correlated with the rate of diffusion of the impurity into germanium. This treatment results in a well defined region or zone of P-type material, such as the zone 16, adjoining the unchanged portion of the body, such as the reduced zone 18, at an electrical barrier 20 or interface between the zones of the opposite conductivity types. Diffusion occurs at the same rate throughout the area of the face 12, converting the initial N-type material to P-type material where the P-type impurity exceeds the N-type impurity concentration present initially. Accordingly, the barrier or P–N junction 20 lies substantially in a single plane spaced from and parallel to the face 12 of the body 10.

Thereafter, the body 10 having the semiconductive zones of opposite conductivity types is treated to remove the residual concentration of the acceptor impurity layer 14. For the purposes of illustration, this is accomplished by etching with suitable reagents or by grinding away the impurity layer and any surface layer of the germanium that may be of unduly low resistivity. The initial N-type portion is of uniform resistivity or of resistivity that varies in a known way as a function of the body thickness. The resistivity of the P-type region varies from a minimum at the surface from which the acceptor impurity was introduced to a maximum at the P–N junction.

After cleaning the face 12, a layer of donor impurities 26 is suitably applied. The impurity layer 26 is likewise of the same concentration throughout the surface area, this concentration being limited by the percentage of impurity that will alloy in solid state with the germanium. Upon the application of heat to the body 10, the donor impurities will diffuse uniformly throughout the area into the adjacent regions of P-type material to reconvert the same into a zone 28 of N-type conductivity. The zone 28 of N-type conductivity adjoins the zone 16 of P-type material at a further electrical barrier or junction 30, the heat treatment having the effect of advancing barrier 20 as a result of further diffusion of the acceptor impurity previously introduced. The extent of diffusion is of course determined by the period and temperature of treatment, and the type and amount of donor impurity. For example, in the same period of heat treatment, antimony and arsenic which have the same diffusion coefficients, will both penetrate further than phosphorus which has a lower diffusion coefficient. The surface concentration of the impurity is significant. Certain materials are gaseous at temperatures used for diffusion and this factor should be taken into account.

The processed semiconductor body 10 need not be treated to remove the residue of the donor impurity layer 26, which can be used as an ohmic electrical terminal, the high surface concentration of the impurity converting the surface essentially to a conductor. Accordingly, the present method provides for the controlled formation of multiple junction semiconductors having prescribed regions of material of the same conductivity type adjoining an intermediate layer of the opposite conductivity type at well defined electrical barriers. The separation between the barriers is relatively easily controlled because errors in processing that promote different advances of barrier 30 are also effective to change the location of barrier 20; and as a result the thickness of layer 16 can be controlled with relative ease. Finally, the total thickness of the semiconductor body is of no controlling importance on the thickness of the center layer which is influenced only by the surface concentrations and the temperature.

As previously pointed out, the foregoing method can be employed in the preparation of P–N–P multiple junctions. This is accomplished by starting with a semiconductor body of P-type material and reversing the order of diffusing the impurities into the body 10. The method is also advantageous in providing more than three zones as described, as where five layers or zones of alternately N and P-type material are desired. In that case both surfaces of a slab 10 can be treated as described, or multiple reversals can be effected from one surface.

Figure 2:
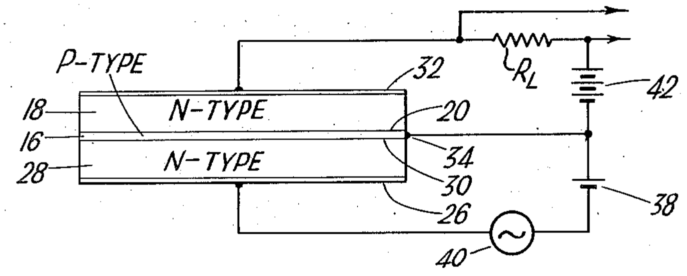
Fig. 2 is a schematic illustration of a semiconductor processed in accordance with the method of Fig. 1 and incorporated as an element of a transistor circuit.

In Fig. 2, there is illustrated an N–P–N junction transistor constructed with a semiconductor body 10 processed by the present method. Connections are made to each of the zones or layers 16, 18, 28 by electrodes 32, 34 and 26 respectively, which may be designated by conventional nomenclature as the collector 32 the base 34, and the emitter 26. The transistor may be operated as an amplifier in accordance with known practices by applying thereto a small bias from a battery 38 and a signal from a source 40. The bias voltage is of the order of one volt, the positive terminal of the battery 38 being connected to the base electrode 34. The output circuit included a load, represented by a resistor $R_L$ and a relatively high voltage source 42, the latter having its negative pole connected to the base electrode 34 and its positive pole to the collector 32 via the load. Preferably the impedance of the P-zone 16 to electron flow will be low enough so that the introduction of current carriers into the P zone by the positive bias therein will have the requisite control effect. This can be readily accomplished by making the P zone exceptionally thin through accurate control of the differential between the diffusion steps previously described. In operation, the carriers at barrier 30 produce amplification of the energy resulting from electron flow through barrier 20. The relatively low resistivity of zone 28 compared to that of zone 18 enhances the efficiency of the unit as an amplifier.

Figure 3:
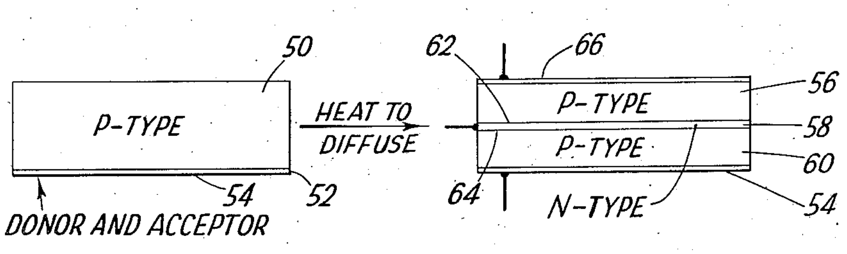
Fig. 3 is a diagrammatic view showing the sequential steps for processing a semiconductor in accordance with a further method of the present invention.

Referring now to Fig. 3, there is illustrated a further sequence of steps embodying aspects of the present invention. This method will be described with a starting material of P-type conductivity and therefore the processed semiconductor will be seen to include two spaced apart P-type zones adjoined at barriers by an intermediate N-type zone. Specifically, a body 50 of high resistivity P-type material has one face 52 provided with a layer 54 of donor and acceptor impurities selected from the groups III and V elements in accordance with techniques to be subsequently set forth in detail, or one or both of these impurities may be in gaseous form during the diffusion heat-treatment. The composite impurity layer illustrated is deposited on the face 52 of body 50 by vacuum-evaporating, electroplating or the like. In practicing this method with P-type starting material, the donor impurity is selected to have a greater diffusion rate through the semiconductor body 50, than the acceptor impurity. The following table indicates the relative diffusion rates of a few impurities, the rates being determined by the diffusion coefficients, the temperature, and the surface impurity concentration.

| | Diffusion Coefficient at 900° C. ($cm.^2/sec.$) |
|---|---|
| Donor Impurities: | |
| Antimony | 2×10−10 ($2\times10^{-10}$) |
| Arsenic | 2×10−10 |
| Phosphorus | 8×10−11 |
| Acceptor Impurities: | |
| Zinc | 1×10−11 |
| Gallium | 3×10−12 |
| Indium | 2×10−13 |

Any of the above donors, phosphorus, antimony or arsenic, may be taken in conjunction with any of the acceptor impurities. Selection of the proper relative diffusion rates for a given period of heat treatment will result in exceptionally accurate control over the formation of the intermediate zone, which for the present starting material will be of N-type conductivity. The impurity layer is preferably uniform throughout the area of the face 52. The relative amounts and concentrations of impurities used during the diffusion heat treatment are chosen to assure the reconversion of the material to P-type behind the diffusing donor impurity which converts the original P-type starting material into material of N-type conductivity.

During or after the impurity layer 54 is formed, heat treatment is commenced, thereby causing the impurities to diffuse into the body 50. This diffusion, which occurs during the heat treatment and at rates determined by the temperature, the selected donor and acceptor impurities and their relative surface concentrations, causes the original P-type starting material to be converted into three superposed layers, including a P-type zone 56 of the original material, an N-type zone 58 of a thickness determined by the differential diffusion rates and concentrations of the impurities and the impurity concentration in initial P-type zone 56, and another P-zone 60 resulting from the original impurity in layer 54 and from the added acceptor impurities that predominate over the donor impurities in this layer. Rectifying barriers 62 and 64 exist at the junction 56—58 and at the junction 58—60; and the layer 54 constitutes a high-concentration impurity surface that acts as, or is improved as by electroplating to act as, an ohmic connection. Connection 66 is formed on zone 56 and ohmic contact is also made to zone 58 in completing the unit.

Heat treatment for diffusion at temperatures above 500° C. tends to introduce lattice defects into the crystal that affects the resulting device. Such defects may be minimized by annealing, as at 500° C. for 24 hours; or gradual cooling during and after diffusion may be substituted for this separate annealing.

The unit shown in Fig. 3 is connected in a circuit like that in Fig. 2 but with reverse potentials applied accordingly no further explanation is deemed necessary.

From the foregoing, varied application of the novel aspects of the invention will occur to those skilled in the art, and variating in matters of detail will be apparent; and therefore it is appropriate that the appended claims be accorded a latitude of interpretation, consistent with the spirit and scope of the invention.

What I claim is:

1. The method of forming a junction transistor comprising the steps of exposing one face of a body of semiconductor material of the group consisting of germanium and silicon, of one conductivity type, to a first impurity capable of imparting the opposite conductivity type to said material, heating said body to cause diffusion of said impurity into said body and to convert a zone of said body into said opposite conductivity type, depositing on said face a layer of a second impurity capable of imparting said one conductivity type to the material in said zone, heating the body at a temperature and for a time sufficient to cause diffusion of only a portion of said layer of impurity into said zone and to cause reconversion of a region of said zone into material of said one conductivity type and applying electrodes to the original unconverted portion of said body and the portion of said zone not reconverted and a connection to the ohmic terminal formed by the portion of said layer of impurity not diffused into said zone.

2. The method of claim 1 in which said body of semiconductor material is of N-type conductivity, said first impurity is a P-type conductivity imparting impurity, and said second impurity is an N-type conductivity imparting impurity.

References Cited in the file of this patent

UNITED STATES PATENTS

| | | |
|---|---|---|
| 2,561,411 | Pfann | July 24, 1951 |
| 2,701,326 | Pfann et al. | Feb. 1, 1955 |